(12) United States Patent
Yamamoto

(10) Patent No.: US 9,514,984 B1
(45) Date of Patent: Dec. 6, 2016

(54) SEMICONDUCTOR DEVICE AND METHOD FOR MANUFACTURING SAME

(71) Applicant: Kabushiki Kaisha Toshiba, Minato-ku (JP)

(72) Inventor: Katsumi Yamamoto, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/011,831

(22) Filed: Feb. 1, 2016

Related U.S. Application Data

(60) Provisional application No. 62/214,430, filed on Sep. 4, 2015.

(51) Int. Cl.
| | |
|---|---|
| *H01L 21/326* | (2006.01) |
| *H01L 23/48* | (2006.01) |
| *H01L 21/768* | (2006.01) |
| *H01L 21/027* | (2006.01) |
| *H01L 21/033* | (2006.01) |
| *H01L 21/311* | (2006.01) |
| *H01L 23/528* | (2006.01) |
| *H01L 27/115* | (2006.01) |

(52) U.S. Cl.
CPC ..... *H01L 21/76892* (2013.01); *H01L 21/0271* (2013.01); *H01L 21/033* (2013.01); *H01L 21/31127* (2013.01); *H01L 21/31144* (2013.01); *H01L 23/5283* (2013.01); *H01L 27/1157* (2013.01); *H01L 27/11524* (2013.01)

(58) Field of Classification Search
CPC ............ H01L 21/0271; H01L 21/31127; H01L 21/31144; H01L 21/76892; H01L 23/5283; H01L 27/1157; H01L 27/11524
See application file for complete search history.

(56) References Cited

U.S. PATENT DOCUMENTS

2012/0025402 A1* 2/2012 Bicksler ............. H01L 27/0207
257/786

* cited by examiner

*Primary Examiner* — Hoa B Trinh
(74) *Attorney, Agent, or Firm* — Oblon, McClelland, Maier & Neustadt, L.L.P.

(57) ABSTRACT

A method for manufacturing a semiconductor device includes forming an insulating layer on a semiconductor layer; forming a metal layer on the insulating layer; and forming a first interconnect by selectively etching the metal layer. The first interconnect is electrically connected to the semiconductor layer and has a loop configuration. The method includes forming a first mask layer covering the first interconnect and the insulating layer; and forming a second mask layer on the first mask layer. The second mask layer has a first opening over a portion of the first interconnect. The method further includes exposing the portion of the first interconnect by selectively removing the first mask layer using the second mask layer; and forming a second interconnect by selectively removing the portion of the first interconnect using the first mask layer. The second interconnect has two ends and is electrically connected to the semiconductor layer.

15 Claims, 15 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/214,430 filed on Sep. 4, 2015; the entire contents of which are incorporated herein by reference.

FIELD

Embodiments are generally related to a semiconductor device and a method for manufacturing the same.

BACKGROUND

As the integration degree in a semiconductor device becomes higher, interconnect spacing inside the device becomes narrower. Accordingly, a manufacturing method thereof is required to have higher precision. For example, in the side wall process, which is used for forming interconnects, a loop shaped metal layer on a insulating layer is cut by etching, providing two interconnects that are adjacent to one another and electrically isolated. In this process, the etching is desired to be suppressed in the insulating layer.

DETAILED DESCRIPTION

Figure 1A:
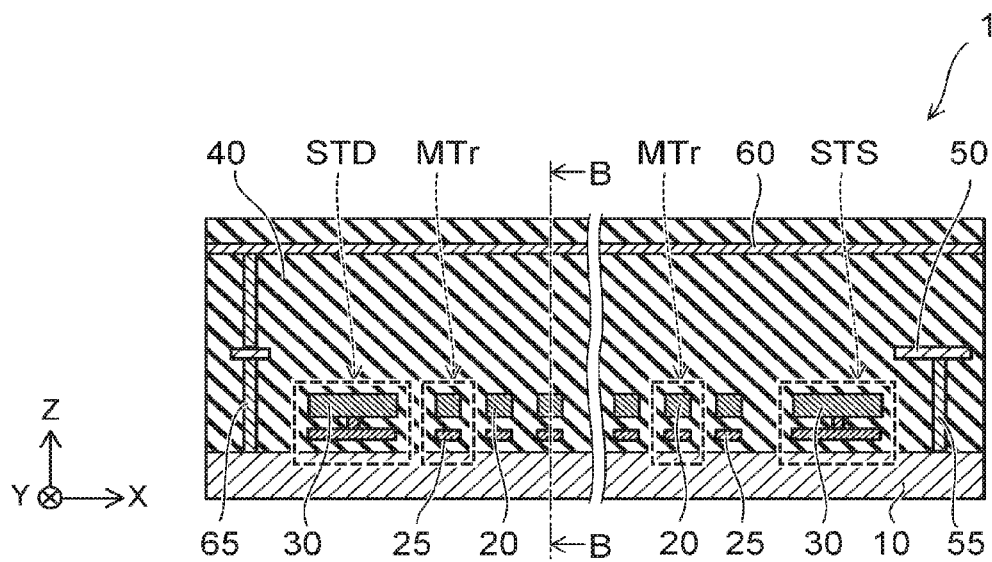
FIGS. 1A and 1B are schematic cross-sectional views showing a semiconductor device according to an embodiment.

According to an embodiment, a method for manufacturing a semiconductor device includes forming an insulating layer on a semiconductor layer; forming a metal layer on the insulating layer; and forming a first interconnect by selectively etching the metal layer. The first interconnect is electrically connected to the semiconductor layer and has a loop configuration. The method includes forming a first mask layer covering the first interconnect and the insulating layer; and forming a second mask layer on the first mask layer. The second mask layer has a first opening over a portion of the first interconnect. The method further includes exposing the portion of the first interconnect by selectively removing the first mask layer using the second mask layer; and forming a second interconnect by selectively removing the portion of the first interconnect using the first mask layer. The second interconnect has two ends and is electrically connected to the semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
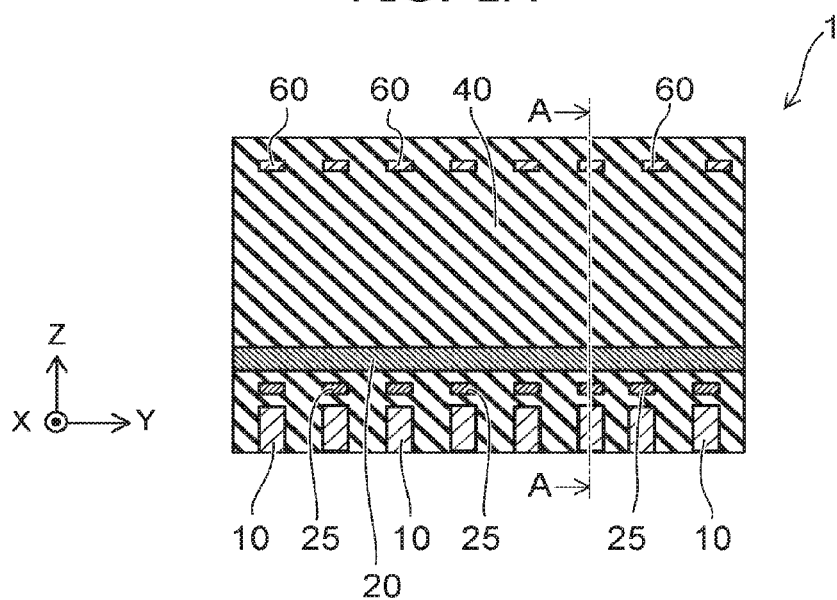

FIGS. 1A and 1B are schematic cross-sectional views showing a semiconductor device 1 according to an embodiment. FIG. 1A is a cross-sectional view along line A-A shown in FIG. 1B; and FIG. 1B is a cross section along line B-B shown in FIG. 1A.

The semiconductor device 1 is, for example, a NAND semiconductor memory device. As shown in FIG. 1A, the semiconductor device 1 includes multiple memory transistors MTr, a selection transistor STS, and a selection transistor STD arranged on a semiconductor layer 10. The semiconductor layer 10 is, for example, a portion of a semiconductor layer or a well layer provided on a silicon substrate.

As shown in FIG. 1A, the memory transistor MTr includes a word line 20 and a charge storage layer 25. The charge storage layer 25 is provided between the semiconductor layer 10 and the word line 20. The charge storage layer 25 includes, for example, polysilicon and is electrically insulated from the semiconductor layer 10 and the word line 20. Multiple memory transistors MTr are provided between the selection transistors STS and STD. Each of the selection transistors STS and STD includes a selection gate 30.

An inter-layer insulating layer 40 is provided on the memory transistors MTr and the selection transistors STS and STD. The inter-layer insulating layer 40 includes a source line 50, a source contact body 55, and a drain contact body 65. The inter-layer insulating layer 40 is, for example, a silicon oxide layer.

For example, the source contact body 55 extends in the Z-direction through the inter-layer insulating layer and electrically connects the semiconductor layer 10 to the source line 50. For example, the source contact body 55 contacts the semiconductor layer 10 on the source side of the selection transistor STS.

The semiconductor device 1 further includes a bit line 60 provided on the inter-layer insulating layer 40. The bit line 60 extends in, for example, the X-direction on the inter-layer insulating layer 40. The bit line 60 is electrically connected to the semiconductor layer 10 by the drain contact body 65. The drain contact body 65 extends in the Z-direction through the inter-layer insulating layer 40. For example, the drain contact body 65 contacts the semiconductor layer 10 on the drain side of the selection transistor STD.

As shown in FIG. 1B, the semiconductor layer 10 includes the multiple semiconductor layers 10 and the multiple bit lines 60. The multiple semiconductor layers 10 are arranged in the Y-direction. The word line 20 extends in the Y-direction over the multiple semiconductor layers 10. The charge storage layer 25 is provided between the word line 20 and a semiconductor layer 10 at a portion where the word line 20 crosses the semiconductor layer 10. Also, the selection gate 30 extends in the Y-direction over the multiple semiconductor layers 10.

The multiple bit lines 60 are arranged in the Y-direction on the inter-layer insulating layer 40. Each of the multiple bit lines 60 is electrically connected via the drain contact body 65 to the semiconductor layer 10 disposed below the drain contact body 65.

A method for manufacturing the multiple bit lines 60 will now be described with reference to FIGS. 2A to 11B. FIGS. 2A to 11B are schematic views showing the manufacturing processes of the bit lines 60. Hereinbelow, FIGS. 3B, 4B, 5B, 6B, and 11B are top views; and the other drawings are Y-Z cross-sectional views.

Figure 2A:
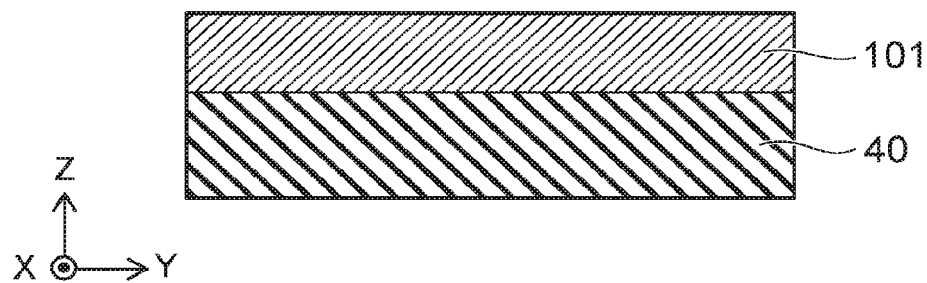
FIGS. 2A to 11B are schematic views showing a manufacturing processes of the semiconductor device according to the embodiment.

As shown in FIG. 2A, a metal layer 101 is formed on the inter-layer insulating layer 40. The inter-layer insulating layer 40 is, for example, a silicon oxide layer formed using CVD (Chemical Vapor Deposition). The metal layer 101 is, for example, a tungsten layer that is deposited on the inter-layer insulating layer 40 using CVD. For example, the metal layer 101 may have a multilayered structure including titanium nitride and tungsten. The metal layer 101 is electrically connected to the semiconductor layer 10 by the drain contact body 65.

Figure 2B:
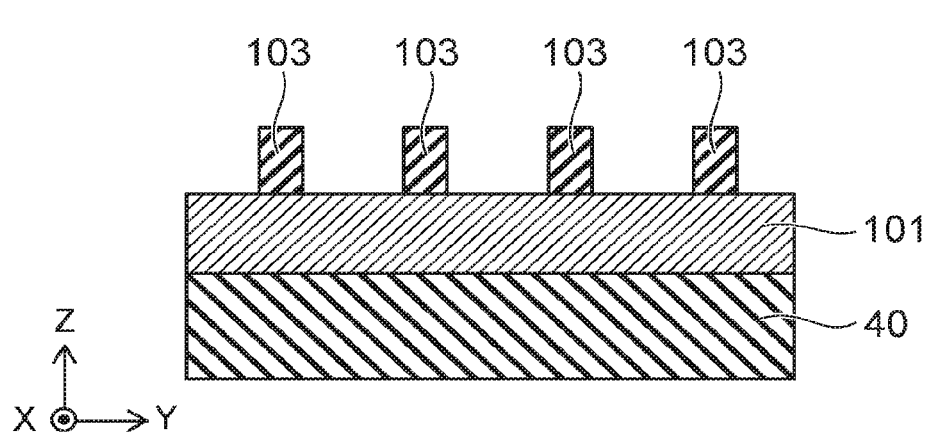

As shown in FIG. 2B, first insulating layers 103 are formed on the metal layer 101. The first insulating layers 103 are, for example, silicon nitride layers formed using CVD. For example, the first insulating layers 103 are formed in a line-and-space configuration using photolithography. Each of the first insulating layers 103 extends in the X-direction.

Figure 2C:
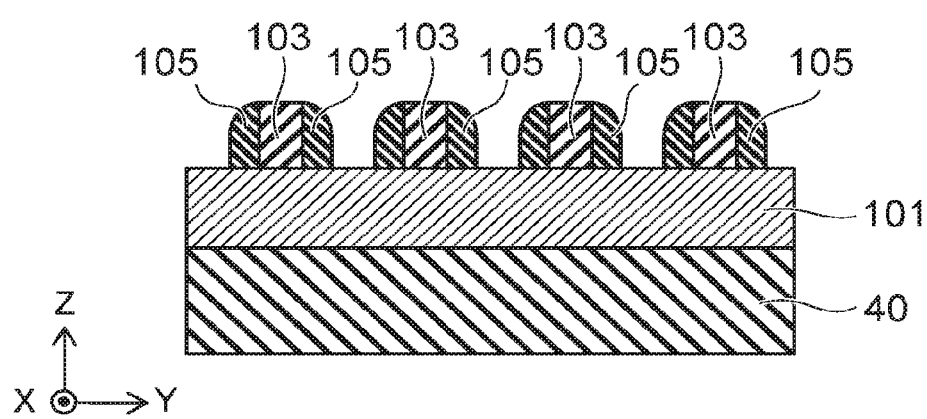

As shown in FIG. 2C, second insulating layers 105 that cover the side surfaces of the first insulating layers 103 are formed. The second insulating layers 105 are so-called sidewalls and are formed using, for example, CVD and anisotropic RIE (Reactive Ion Etching). Specifically, a silicon oxide layer is formed using CVD to cover the first insulating layers 103 on the metal layer 101. Then, the silicon oxide layer is removed using anisotropic RIE, leaving the portions on the side surfaces of the first insulating layers 103, which are the second insulating layers 105.

Figure 3A:
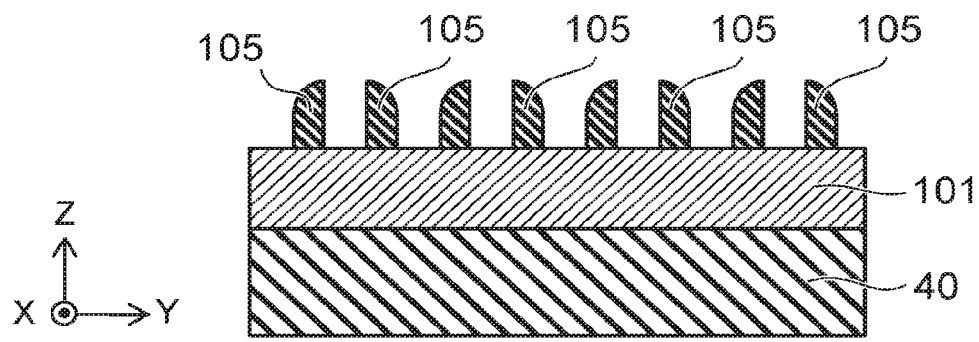

As shown in FIG. 3A, the first insulating layers 103 are selectively removed; and the second insulating layers 105 remain on the metal layer 101. For example, the second insulating layers 105 remain on the metal layer 101 after the silicon nitride layers are selectively removed by etching using phosphoric acid.

Figure 3B:
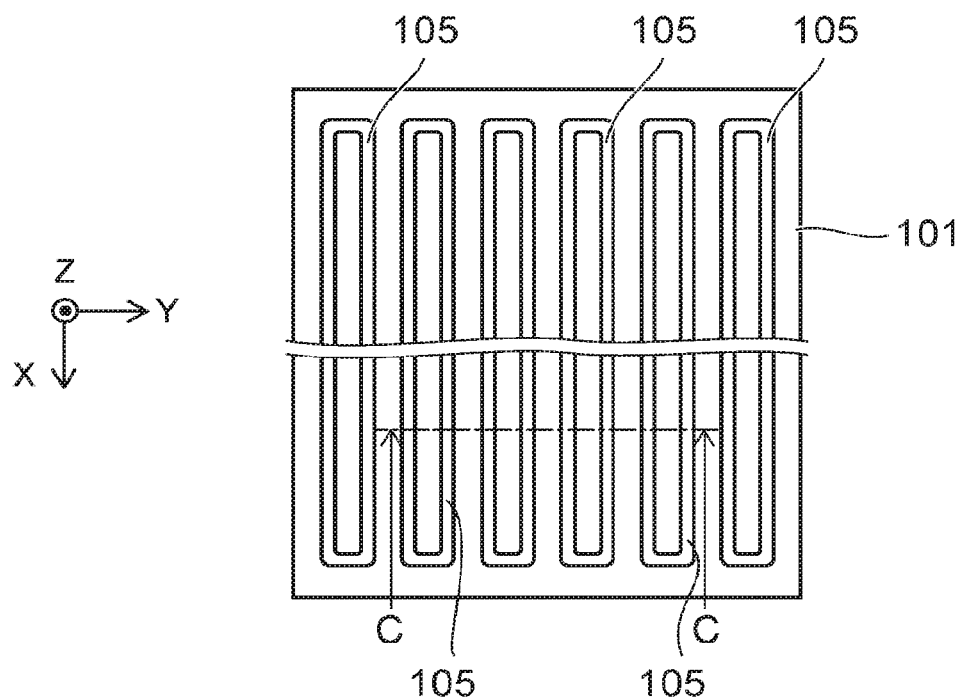

FIG. 3A is, for example, a cross section along line C-C shown in FIG. 3B. As shown in FIG. 3B, the second insulating layers 105 are formed in loop configurations extending in the X-direction. In other words, the sidewalls that are formed on the side surfaces of the first insulating layers 103 remain with the stripe configurations extending in the X-direction.

Figure 4A:
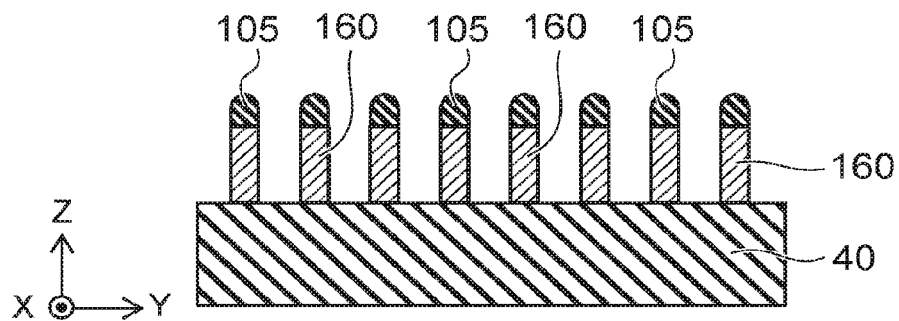
Figure 4B:
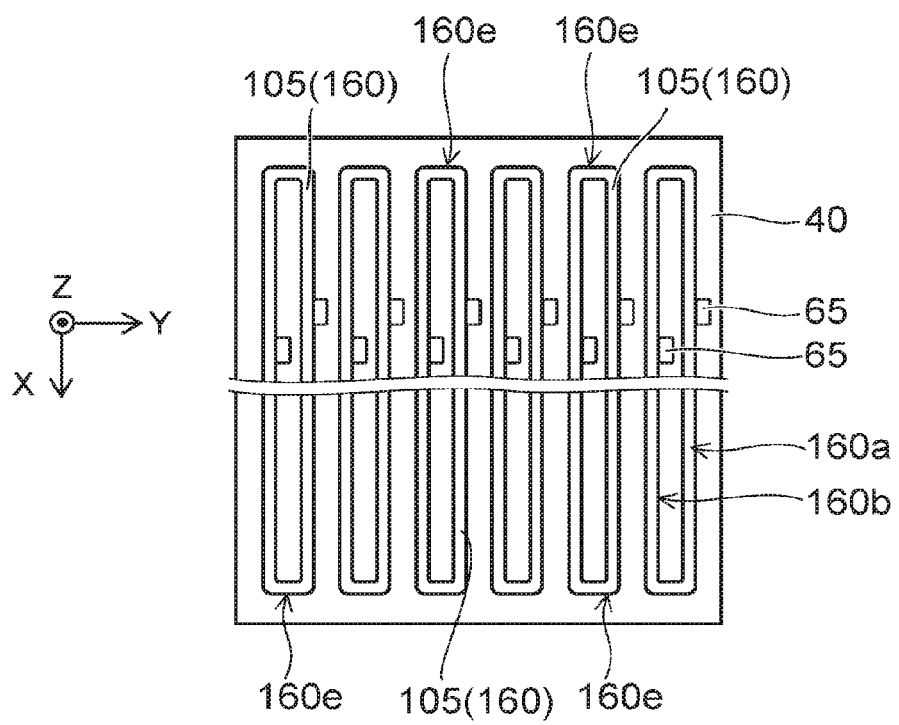

As shown in FIGS. 4A and 4B, first interconnects 160 that have loop configurations are formed on the inter-layer insulating layer 40. The first interconnects 160 are formed by selectively etching the metal layer 101 using the second insulating layers 105 as a mask.

The metal layer 101 is removed using, for example, anisotropic RIE. The first interconnects 160 include first portions 160a, second portions 160b, and end portions 160e. The first portions 160a and the second portions 160b extend in the X-direction. The end portions 160e link the first portions 160a to the second portions 160b.

For example, the first portions 160a and the second portions 160b are positioned on the drain contacts 65 exposed at the top surface of the inter-layer insulating layer 40. The first interconnects 160 are electrically connected to the semiconductor layer 10 via the drain contact bodies 65.

Figure 5A:
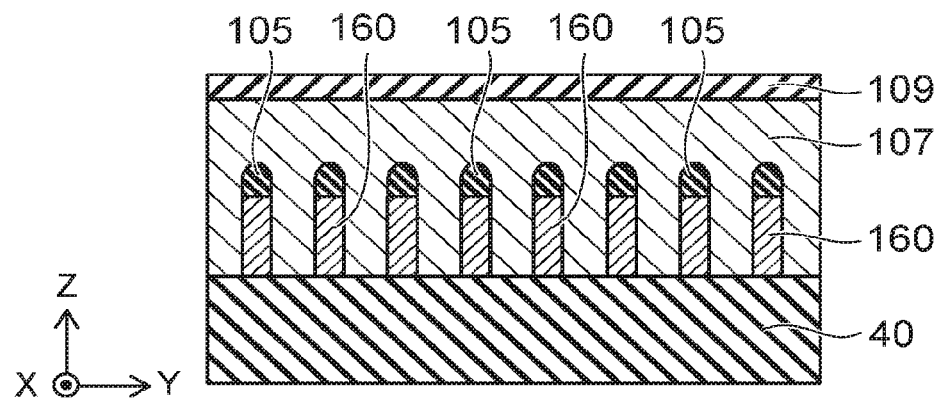
Figure 5B:
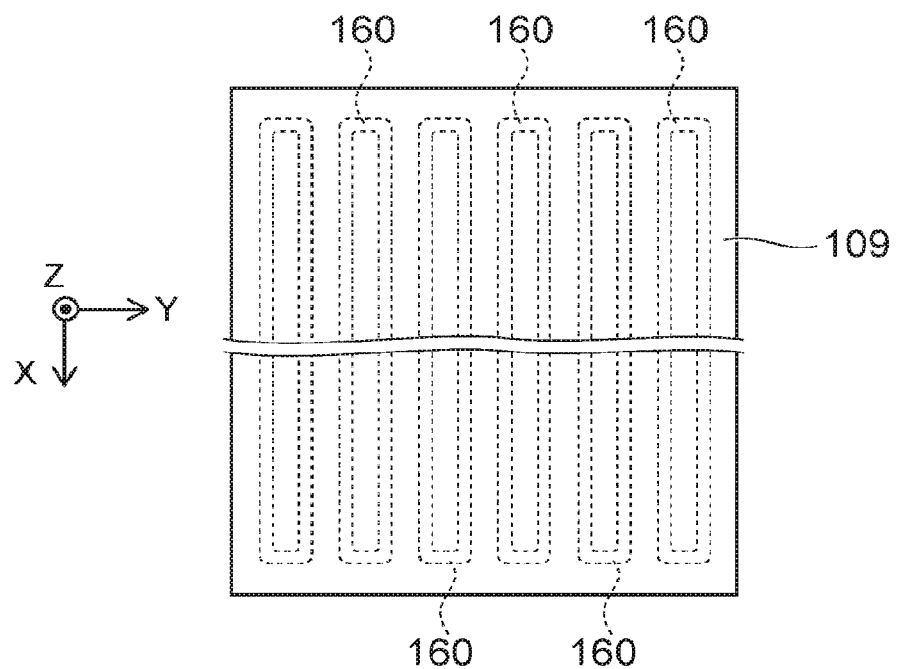

As shown in FIGS. 5A and 5B, a first mask layer 107 and a second mask layer 109 are formed on the inter-layer insulating layer 40. The first mask layer 107 covers the first interconnects 160 on the inter-layer insulating layer 40. The second mask layer 109 is formed on the first mask layer 107.

The first mask layer 107 includes, for example, a material having a slower etching rate than an etching rate of the first interconnects 160 for prescribed etching conditions. The first mask layer is, for example, a carbon layer which includes carbon and a matrix material. For example, the first mask layer is provided on the inter-layer insulating layer 40 using CVD or spin coating. The second mask layer 109 is, for example, a silicon oxide layer or a silicon nitride layer formed using CVD.

Figure 6A:
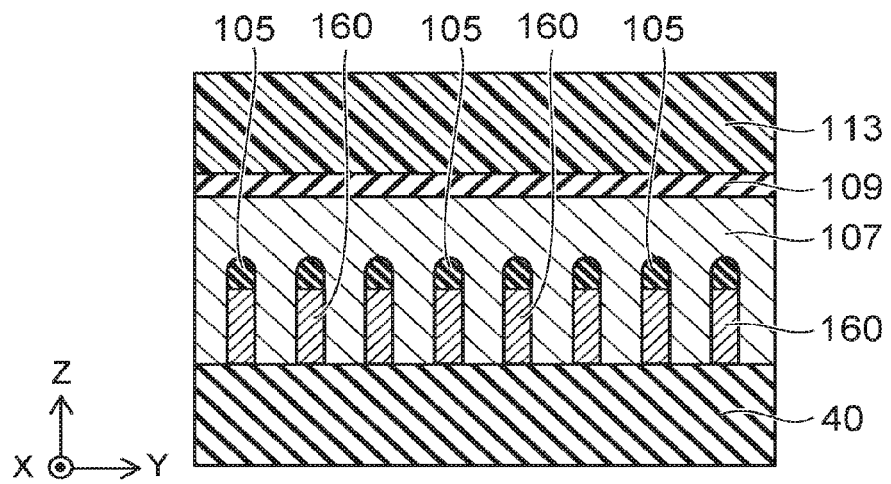
Figure 6B:
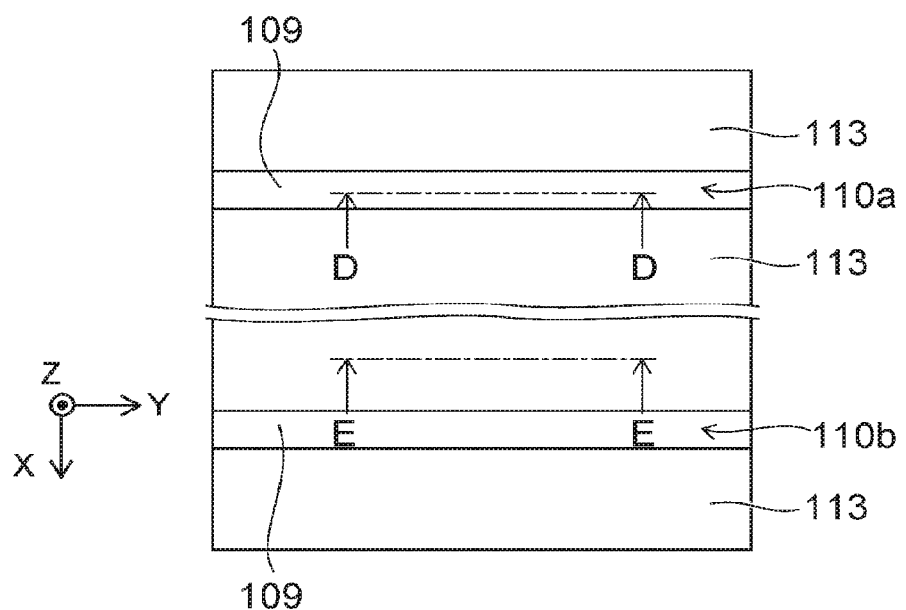

As shown in FIGS. 6A and 6B, a resist mask 113 is formed on the second mask layer 109. FIG. 6A is a cross-sectional view along line E-E shown in FIG. 6B. The resist mask 113 is, for example, a photoresist.

As shown in FIG. 6B, the resist mask 113 has openings 110a and 110b. For example, the openings 110a and 110b extend in the X-direction, and each crosses the first interconnects 160. For example, the openings 110a and 110b are formed using photolithography.

Continuing, the second mask layer 109 is selectively removed using the resist mask 113; and the openings 110a and 110b each expand downward. In other words, openings formed in the second mask layer 109 have the same configurations as the configurations of the openings 110a and 110b.

Figure 7A:
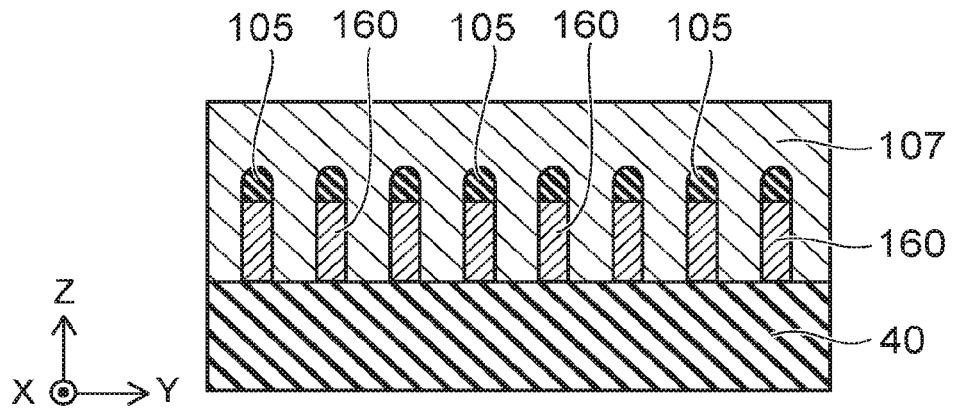
Figure 7B:
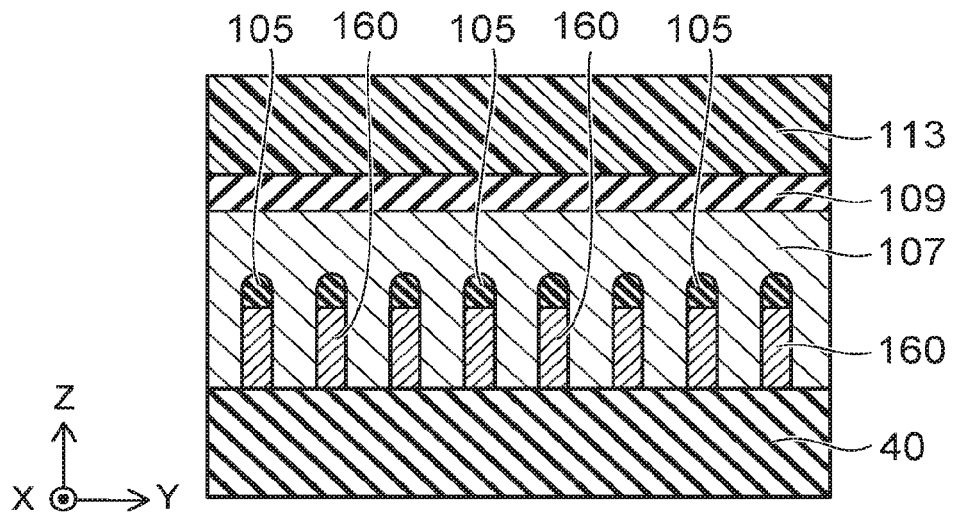

FIGS. 7A and 7B are cross-sectional views after the second mask layer 109 is selectively removed. FIG. 7A is a cross-sectional view along line D-D shown in FIG. 6B; and FIG. 7B is a cross-sectional view along line E-E shown in FIG. 6B. As shown in FIG. 7A, the first mask layer 107 is exposed at the bottom surfaces of the openings 110a and 110b.

Figure 8A:
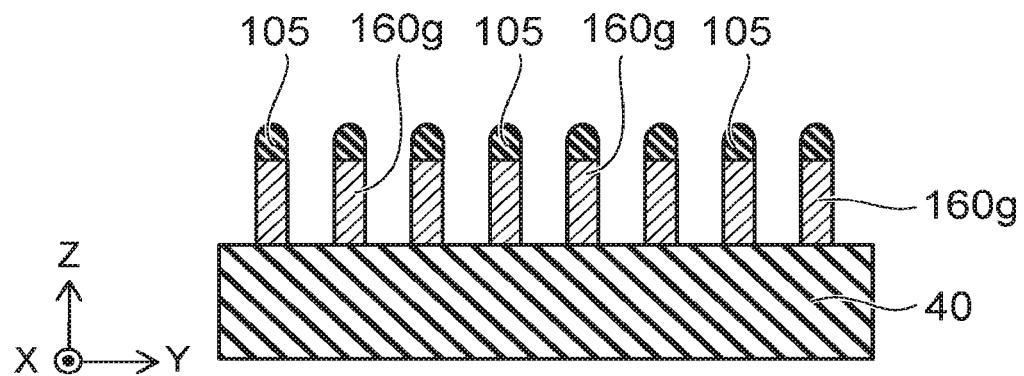
Figure 8B:
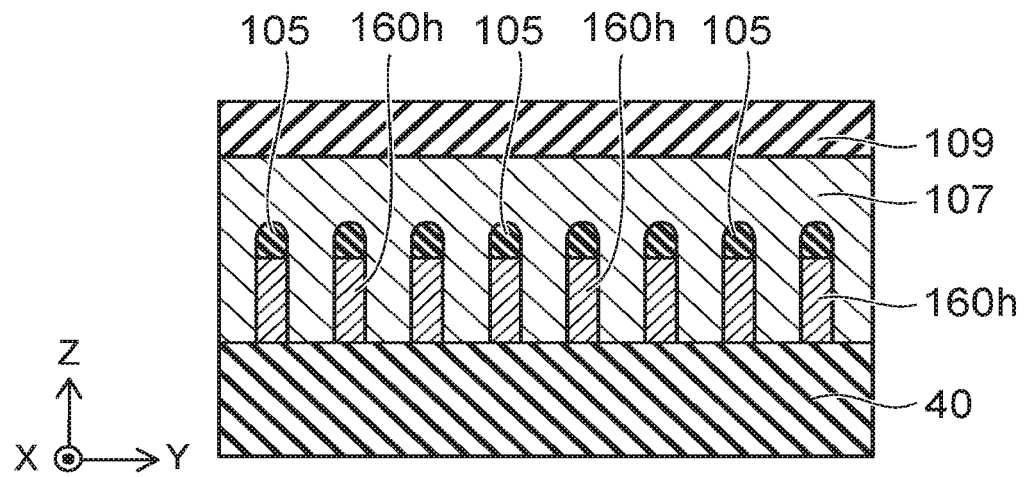

As shown in FIGS. 8A and 8B, the first mask layer 107 is selectively removed using the second mask layer 109. FIG. 8A is a cross-sectional view along line D-D shown in FIG. 6B; and FIG. 8B is a cross-sectional view along line E-E shown in FIG. 6B.

For example, the first mask layer 107 can be removed by RIE. Thereby, the openings 110a and 110b expand further downward; and portions 160g of the first interconnects 160 are exposed respectively in the openings 110a and 110b. Also, as shown in FIG. 8B, the resist mask 113 that is on the second mask layer 109 also is removed by RIE. Other portions 160h of the first interconnects 160 are covered with the first mask layer 107 and the second mask layer 109.

Figure 9A:
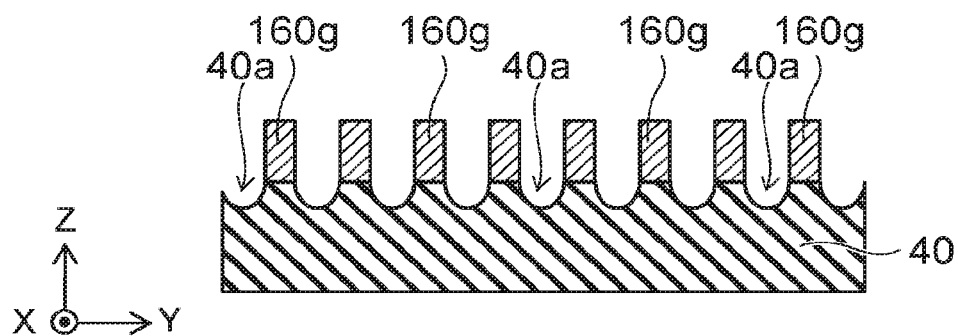
Figure 9B:
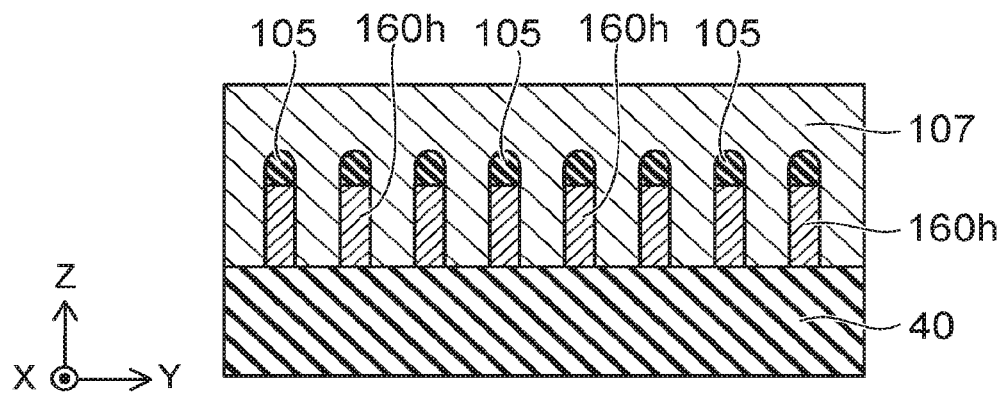

As shown in FIGS. 9A and 9B, the portions 160g of the first interconnects 160 are removed, which are exposed respectively in the openings 110a and 110b. FIG. 9A is a cross-sectional view along line D-D shown in FIG. 6B; and FIG. 9B is a cross-sectional view along line E-E shown in FIG. 6B.

For example, the portions 160g of the first interconnects 160 are removed using RIE. The second insulating layers 105 on the portions 160g and the second mask layer 109 that remain on the portions 160h of the first interconnects 160 (referring to FIG. 9B) also are removed simultaneously. As shown in FIG. 9A, there are cases where the inter-layer insulating layer 40 also is etched in the openings 110a and 110b; and recesses 40a are formed in the top surface of the inter-layer insulating layer 40. In other words, it is difficult to selectively remove the first interconnects 160 without removing the inter-layer insulating layer 40.

On the other hand, as shown in FIG. 9B, portions 160h of the first interconnects 160 and the inter-layer insulating layer 40 are not removed at the region covered with the first mask layer 107. The first mask layer 107 is resistant to the etching condition of the portions 160g and protects the portions 160h of the first interconnects 160. In such a case as well, it is difficult to select the conditions under which the first interconnects 160 are removed without removing the first mask layer 107.

Accordingly, a material is selected for the first mask layer 107, which has a slower etching rate than an etching rate of the first interconnects 160 for the prescribed etching conditions. The first mask layer 107 is, for example, a carbon layer that includes carbon and a matrix material. For example, the first mask layer 107 includes carbon having a high concentration and is conductive. Also, it is desirable for the thickness in the Z-direction of the first mask layer 107 to be not less than twice the thickness in the Z-direction of the metal layer 101 that is formed into the first interconnects 160.

Figure 10A:
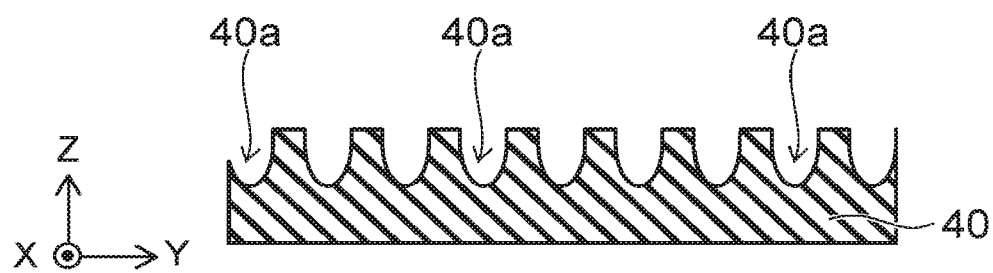
Figure 10B:
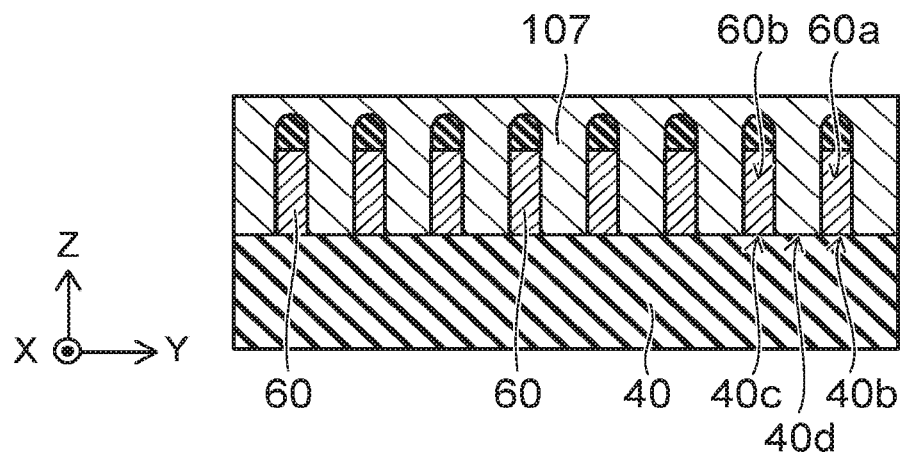

As shown in FIGS. 10A and 10B, the entire portions 160g of the first interconnects 160 exposed in the openings 110a and 110b are removed; and the portions 160h of the first interconnects 160 are formed into the second interconnects (the bit lines 60). FIG. 10A is a cross-sectional view along line D-D shown in FIG. 6B; and FIG. 10B is a cross-sectional view along line E-E shown in FIG. 6B.

As shown in FIG. 10A, the portions 160g of the first interconnects 160 are removed, which are exposed in the openings 110a and 110b. The recesses 40a are made in the top surface of the inter-layer insulating layer 40 exposed at the bottom of the openings 110a and 110b. For example, the recesses 40a are formed so as not to reach the interconnects (not-shown) provided under the recesses 40a. In other words, the inter-layer insulating layer 40 has a thickness such that the bottoms of the recesses 40a do not reach the lower interconnects.

As shown in FIG. 10B, the portions 160h of the first interconnects 160 covered with the first mask layer 107 are not etched, and formed into the bit line 60. For example, the inner surfaces of the recesses 40a are positioned at a level lower than the top surfaces 40b and 40c of the inter-layer insulating layer 40 directly under the adjacent bit lines 60a and 60b, and also lower than a top surface 40d between the top surfaces 40b and 40c.

Figure 11A:
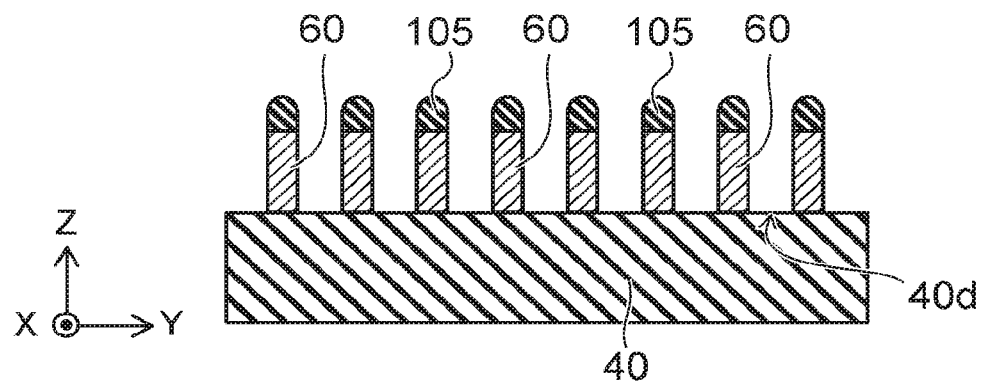
Figure 11B:
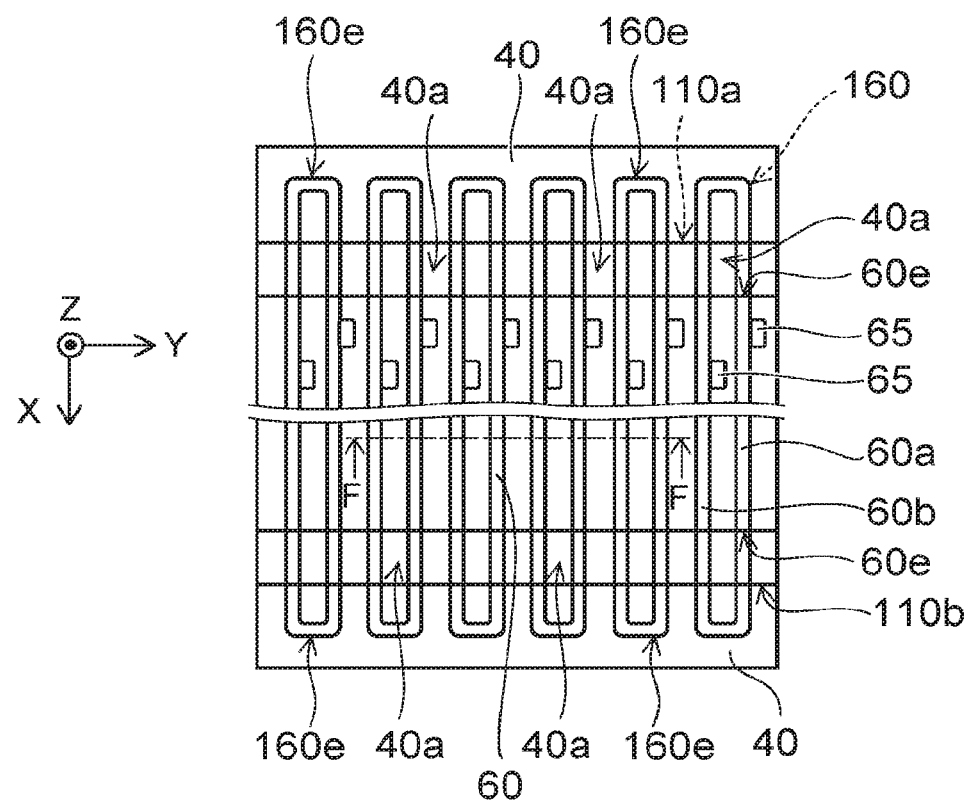

As shown in FIGS. 11A and 11B, the first mask layer 107 is removed; and the bit lines 60 are completed. FIG. 11A is a cross-sectional view along line F-F shown in FIG. 11B. FIG. 11B is a plan view showing the upper surface of the inter-layer insulating layer 40. For example, the first mask layer 107 is selectively removed by ashing using reactive oxygen.

As shown in FIG. 11A, the multiple bit lines 60 are formed on the inter-layer insulating layer 40. The top surface 40d of the inter-layer insulating layer 40 exposed between the adjacent bit lines 60 is not etched while removing the portions 160g of the first interconnect 160. Also, the top surface 40d is not etched in the process of removing the first mask layer 107.

As shown in FIG. 11B, the first interconnects 160 are separated into the adjacent bit lines 60a and 60b and the end portions 160e by the loop cutting in the openings 110a and 110b. The multiple bit lines 60 are formed between the opening 110a and the opening 110b. The bit lines 60 each have two ends 60e. Also, the bit lines 60 are formed on the end surfaces of the drain contacts 65 exposed at the top surface of the inter-layer insulating layer 40. Thereby, the multiple bit lines 60 are electrically connected respectively to the semiconductor layers 10.

A method for manufacturing the bit lines 60 according to a modification of the embodiment will now be described with reference to FIGS. 12A to 15B. FIGS. 12A to 15B are schematic views showing the manufacturing processes continuing from FIG. 7B. Hereinbelow, FIGS. 12A to 15A are cross-sectional views; and FIG. 15B is a plan view showing the upper surface of the insulating layer 40.

Figure 12A:
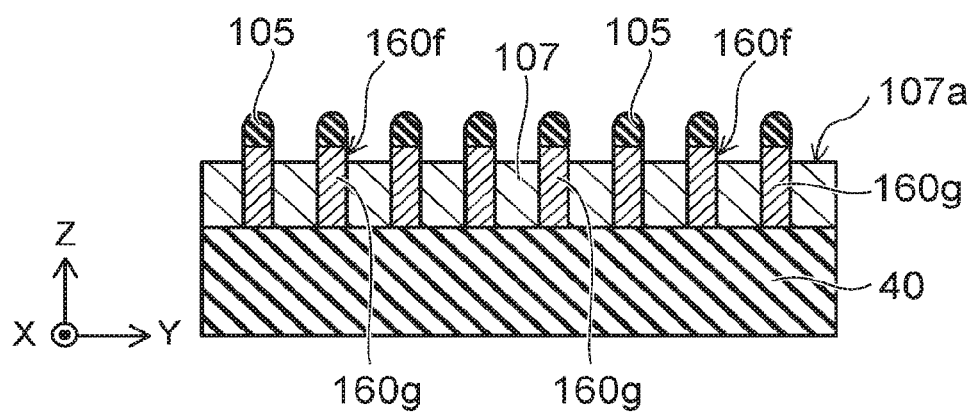
FIGS. 12A to 15B are schematic views showing the manufacturing processes of a semiconductor device according to a variation of the embodiment.
Figure 12B:
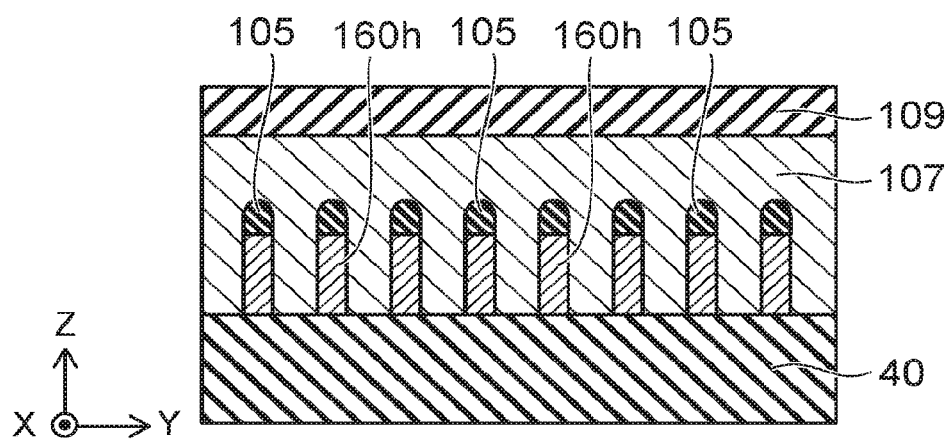

FIG. 12A is a cross-sectional view along line D-D shown in FIG. 6B; and FIG. 12B is a cross-sectional view along line E-E shown in FIG. 6B. As shown in FIG. 12A, the first mask layer 107 is selectively removed such that a part of the first mask layer 107 remains between the portions 160g of the first interconnects 160; and, for example, upper ends 160f of the first interconnects 160 are exposed. Alternatively, the first mask layer 107 may be removed so that a top surface 107a of the first mask 107 is positioned to be higher than the upper ends 160f of the first interconnects 160 and to expose the upper ends of the second insulating layers 105 on the portions 160g. In other words, this differs from the embodiment recited above in that parts of the first mask layer 107 remain at the bottoms of the openings 110a and 110b. As shown in FIG. 12B, portions 160h of the first interconnects 160 are covered with the first mask layer 107 and the second mask layer 109.

Figure 13A:
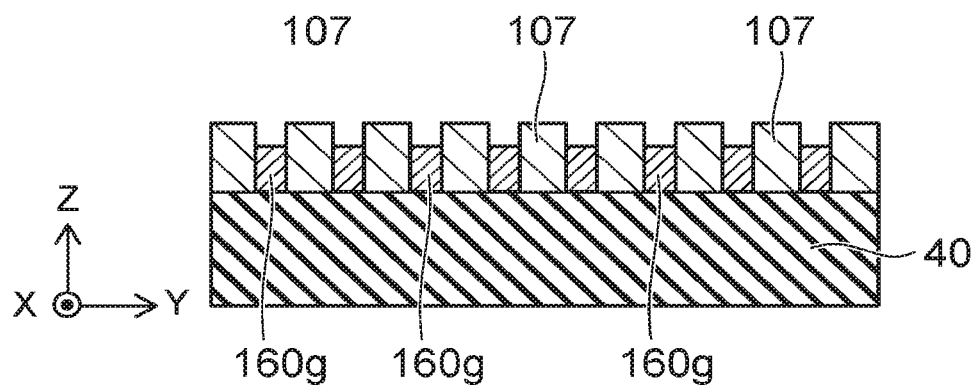
Figure 13B:
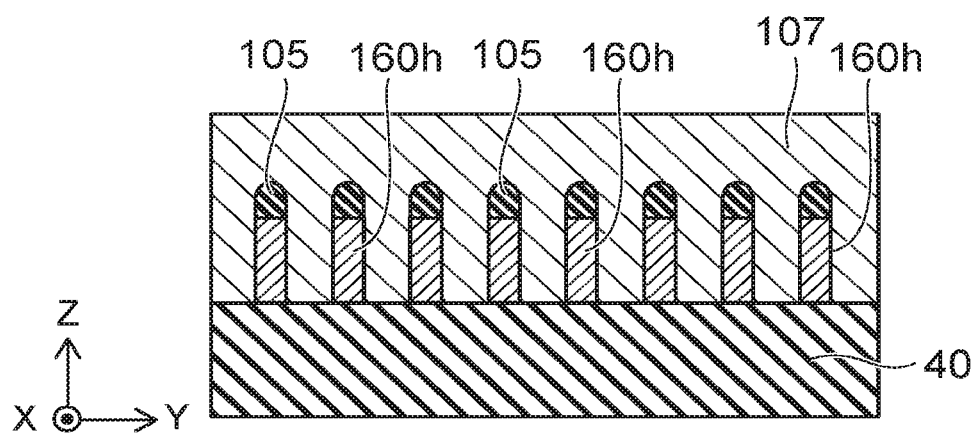

As shown in FIGS. 13A and 13B, the second insulating layers 105 and portions 160g of the first interconnects 160 are removed in the openings 110a and 110b. FIG. 13A is a cross-sectional view along line D-D shown in FIG. 6B; and FIG. 13B is a cross-sectional view along line E-E shown in FIG. 6B.

The portions 160g of the first interconnects 160 are removed using, for example, RIE. As shown in FIG. 13A, the inter-layer insulating layer 40 is not etched because the parts of the first mask layer 107 remains between the adjacent portions 160g of the first interconnects 160. Also, as shown in FIG. 13B, although the second mask layer 109 also is removed, portions 160h of the first interconnects 160 that are covered with the first mask layer 107 are not etched.

Figure 14A:
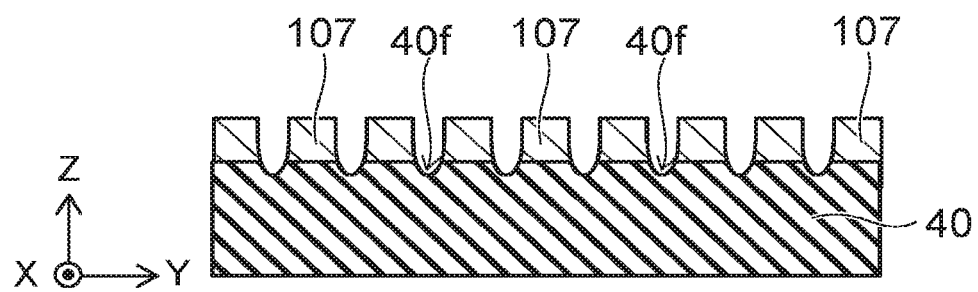
Figure 14B:
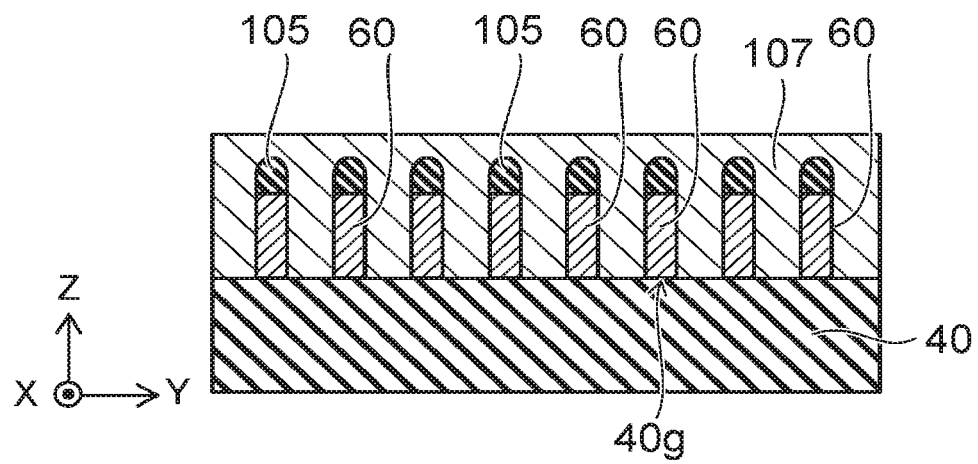

As shown in FIGS. 14A and 14B, the entire portions 160g of the first interconnects 160 exposed in the openings 110a and 110b are removed; and the bit lines 60 are formed at the region covered with the first mask layer 107. FIG. 10A is a cross-sectional view along line D-D shown in FIG. 6B; and FIG. 10B is a cross-sectional view along line E-E shown in FIG. 6B.

As shown in FIG. 14A, the entire portions 160g of the first interconnects 160 exposed in the openings 110a and 110b are removed. The portions 160g of the first interconnects are over-etched in order to be completely removed; and thus, recesses 40f are formed in the top surface of the inter-layer insulating layer 40. The recesses 40f are made directly under the portions 160g of the first interconnects 160 removed by the etching. Although FIG. 14A shows the parts of the first mask layer 107 remaining on the inter-layer insulating layer 40, the parts of the first mask layer 107 may not remain on the bottoms of the openings 110a and 110b after the entire portions 160g of the first interconnects 160 are removed.

Figure 15A:
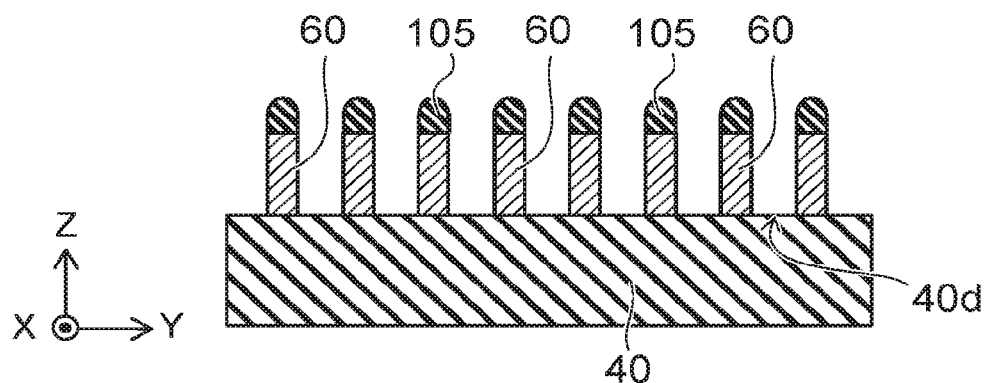
Figure 15B:
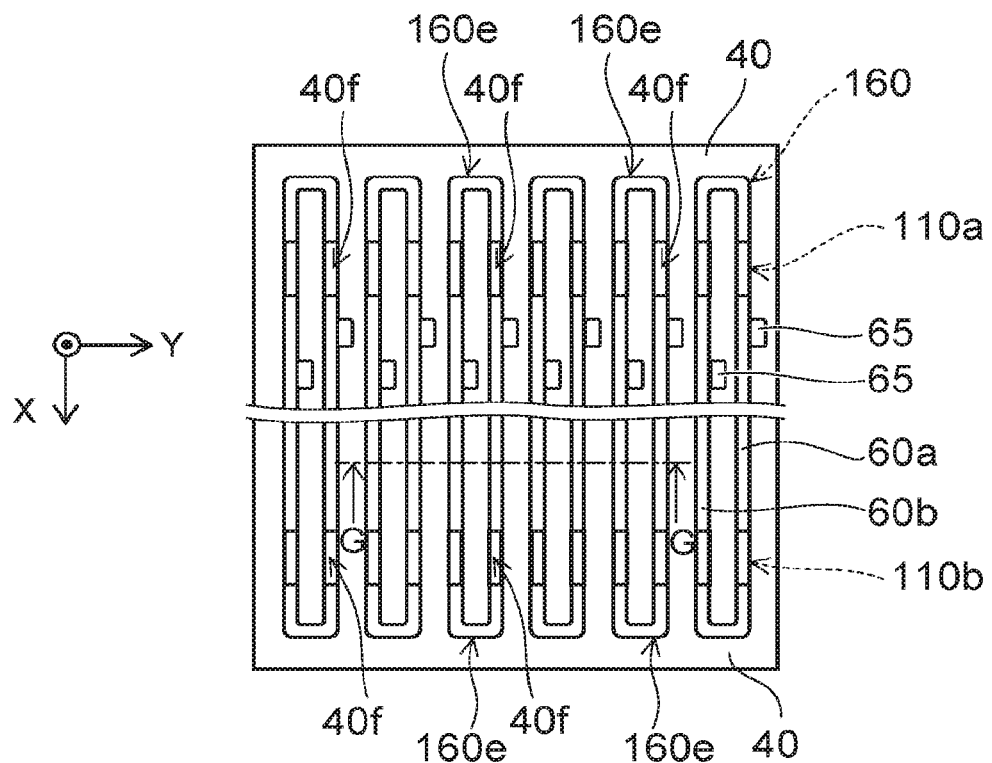

As shown in FIG. 14B, the portion 160h of the first interconnects 160 that are covered with the first mask layer 107 are formed into the bit lines 60 without being etched. For example, the inner surfaces of the recesses 40f are positioned at a level lower than a top surface 40g of the inter-layer insulating layer 40 directly under the bit lines 60. As shown in FIGS. 15A and 15B, the first mask layer 107 is removed; and the bit lines 60 are completed. FIG. 15A is a cross-sectional view along line G-G shown in FIG. 15B. FIG. 15B is a plan view showing the upper surface of the inter-layer insulating layer 40. For example, the first mask layer 107 is selectively removed by ashing using reactive oxygen.

As shown in FIG. 15A, the multiple bit lines 60 are formed on the inter-layer insulating layer 40. For example, the top surface 40d of the inter-layer insulating layer 40 exposed between the adjacent bit lines 60 is covered with the first mask layer 107 and therefore is not etched. Also, the top surface 40d is not etched in the process of removing the first mask layer 107 as well.

As shown in FIG. 15B, the first interconnects 160 are separated into the adjacent bit lines 60a and 60b and the end portions 160e by the loop cutting in the openings 110a and 110b. The multiple bit lines 60 are formed between the opening 110a and the opening 110b. The bit lines 60 each have two ends 60e. Also, the bit lines 60 are formed on the end surfaces of the drain contacts 65 exposed at the front surface of the inter-layer insulating layer 40. Thereby, the multiple bit lines 60 are electrically connected respectively to the semiconductor layers 10.

In the example, the parts of the first mask layer 107 remains in the bottom of the openings 110a and 110b; and the upper ends 160f of the first interconnects 160 are exposed. Thereby, in the process of the loop cutting, wherein the portions 160g of the first interconnects 160 are removed, the recesses 40f formed in the top surface of the inter-layer insulating layer 40 may have the depth not reaching the interconnects under the openings 110a and 110b.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
   forming an insulating layer on a semiconductor layer;
   forming a metal layer on the insulating layer, the metal layer being electrically connected to the semiconductor layer;
   forming a first interconnect by selectively etching the metal layer, the first interconnect being electrically connected to the semiconductor layer and having a loop configuration;
   forming a first mask layer covering the first interconnect and the insulating layer;
   forming a second mask layer on the first mask layer, the second mask layer having a first opening over a portion of the first interconnect;
   exposing the portion of the first interconnect by selectively removing the first mask layer using the second mask layer; and
   forming a second interconnect by selectively removing the portion of the first interconnect using the first mask layer, the second interconnect having two ends and being electrically connected to the semiconductor layer.

2. The method for manufacturing the semiconductor device according to claim 1, wherein
   the first interconnect extends in a first direction on the insulating layer; and
   the second mask layer has the first opening extending over the first interconnect in a second direction crossing the first direction.

3. The method for manufacturing the semiconductor device according to claim 1, wherein the first mask layer is removed to expose an upper end of the portion of the first interconnect.

4. The method for manufacturing the semiconductor device according to claim 2, wherein
   the second mask layer has a second opening arranged in the first direction with the first opening, the second opening extending over the first interconnection in the second direction, and
   the second interconnect is formed under a portion between the first opening and the second opening.

5. The method for manufacturing the semiconductor device according to claim 1, wherein the second interconnect extends in the first direction.

6. The method for manufacturing the semiconductor device according to claim 1, wherein the first interconnect is divided into the second interconnect and another second interconnect.

7. The method for manufacturing the semiconductor device according to claim 1, wherein the second interconnect is electrically connected to the semiconductor layer via a connection conductor provided in the insulating layer.

8. The method for manufacturing the semiconductor device according to claim 1, wherein a thickness of the first mask layer in a third direction is not less than twice a thickness of the metal layer in the third direction, the third direction orthogonal to the first direction and the second direction.

9. The method for manufacturing the semiconductor device according to claim 1, wherein the first mask layer includes carbon.

10. The method for manufacturing the semiconductor device according to claim 1, wherein the second mask layer includes a silicon oxide layer or a silicon nitride layer.

11. A semiconductor device, comprising:
    a first semiconductor layer;
    a second semiconductor layer arranged with the first semiconductor layer;
    an insulating layer provided on the first semiconductor layer and the second semiconductor layer;
    a first interconnect provided on the insulating layer and electrically connected to the first semiconductor layer; and
    a second interconnect provided on the insulating layer and electrically connected to the second semiconductor layer,
    the insulating layer having a surface including a first portion, a second portion, a third portion, and a fourth portion, the first portion being directly under the first interconnect, the second portion being directly under the second interconnect, the third portion being between the first portion and the second portion, the fourth portion being linked to the third portion,
    the fourth portion being positioned at a level lower than the first portion, the second portion, and the third portion in a direction perpendicular to the surface of the insulating layer.

12. The semiconductor device according to claim 11, further comprising a plurality of memory cells arranged along the first semiconductor layer and the second semiconductor layer,
    the insulating layer covering the plurality of memory cells.

13. A semiconductor device, comprising:
a semiconductor layer;
an insulating layer provided on the semiconductor layer; and
an interconnect provided on the insulating layer and electrically connected to the semiconductor layer,
the insulating layer having a surface including a first portion and a second portion, the first portion being directly under the interconnect, the second portion being linked to the first portion at an end of the interconnect,
the second portion being positioned at a level lower than the first portion in a direction perpendicular to the surface of the insulating layer.

14. The semiconductor device according to claim 13, wherein the second portion of the surface extends in the same direction as an extension direction of the interconnect.

15. The semiconductor device according to claim 14, further comprising a plurality of memory cells arranged along the semiconductor layer,
the insulating layer covering the plurality of memory cells.

* * * * *